(12) United States Patent
Daito et al.

(10) Patent No.: US 8,685,631 B2
(45) Date of Patent: Apr. 1, 2014

(54) INSPECTION METHOD FOR PATTERNING OF PHOTORESIST

(75) Inventors: Yoshihiro Daito, Ichihara (JP); Ryuuta Watanabe, Himeji (JP); Yoshitaka Imabayashi, Mobara (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 616 days.

(21) Appl. No.: 12/817,623

(22) Filed: Jun. 17, 2010

(65) Prior Publication Data

US 2010/0323304 A1 Dec. 23, 2010

(30) Foreign Application Priority Data

Jun. 18, 2009 (JP) ................................ 2009-145073

(51) Int. Cl.
*G03F 7/22* (2006.01)
(52) U.S. Cl.
USPC .......................................... 430/325; 430/322
(58) Field of Classification Search
USPC ................................. 430/325, 322
See application file for complete search history.

(56) References Cited

U.S. PATENT DOCUMENTS

| 5,976,256 A * | 11/1999 | Kawano ........................ 118/684 |
| 6,829,559 B2 * | 12/2004 | Bultman et al. .............. 702/155 |
| 2006/0210930 A1 * | 9/2006 | Yamamoto et al. ........... 430/394 |

FOREIGN PATENT DOCUMENTS

| JP | 2000-114166 | 4/2000 |
| JP | 2003-170098 | 6/2003 |
| JP | 2003-289030 | 10/2003 |

* cited by examiner

*Primary Examiner* — Daborah Chacko Davis
(74) *Attorney, Agent, or Firm* — Antonelli, Terry, Stout & Kraus, LLP.

(57) ABSTRACT

A nozzle is moved while supplying a photoresist liquid from a slit. A photoresist layer is formed on a film. A resist pattern which covers a portion of the film is formed from the photoresist layer by photolithography. Inspection of the resist pattern is performed. The photolithography includes an exposure which is performed so as to transfer a latent image to the photoresist layer, and a development of the photoresist layer which is performed so as to leave the latent image. The latent image contains a dummy latent image which extends in an unbroken manner parallel to the longitudinal direction of the slit. The resist pattern contains a dummy resist formed correspondingly to the dummy latent image. The inspection of the resist pattern includes the detection of the presence or non-presence of a cut in the dummy resist in the longitudinal direction.

5 Claims, 8 Drawing Sheets

INSPECTION METHOD FOR PATTERNING OF PHOTORESIST

CROSS-REFERENCE TO RELATED APPLICATION

The present application claims priority from Japanese application JP2009-145073 filed on Jun. 18, 2009, the content of which is hereby incorporated by reference into this application.

BACKGROUND OF THE INVENTION

1. Field of the Invention

The present invention relates to a method of inspecting patterning of a photoresist.

2. Description of the Related Art

There has been known a method which forms a photoresist layer by dropping a photoresist liquid in a strip shape from a slit (discharge port) of a nozzle (JP 2003-170098 A). Although the photoresist liquid dropped in this manner is requested to have a strip shape having a uniform thickness, there has been a case where the thickness of the photoresist liquid becomes non-uniform due to an adhered material on the discharge port.

When the thickness of the photoresist is not uniform at the time of dropping the photoresist liquid, such dropping of the photoresist liquid brings about not only the non-uniform thickness of the photoresist layer but also the formation of a cut in the strip-like photoresist layer. When the cut is formed in the photoresist layer, patterning of the photoresist layer becomes defective. Conventionally, although the patterning inspection is performed based on an image imaged by a camera, the detection of a defect is difficult.

SUMMARY OF THE INVENTION

It is an object of the invention to provide a method of inspecting patterning of a photoresist which can easily perform a patterning inspection of a photoresist layer.

(1) The invention is directed to a method of inspecting patterning of a photoresist including the steps of: forming a photoresist layer on a film formed on a substrate by moving a nozzle in the direction perpendicular to the longitudinal direction of a slit of the nozzle relative to the substrate while supplying a photoresist liquid from the slit of the nozzle above the film; forming a resist pattern which covers a portion of the film by patterning the photoresist layer by photolithography; and inspecting the resist pattern, wherein the photolithography includes an exposure which is performed so as to transfer a latent image to the photoresist layer, and a development of the photoresist layer which is performed so as to leave the latent image, the latent image contains a dummy latent image which extends in an unbroken manner parallel to the longitudinal direction of the slit, the resist pattern contains a dummy resist formed correspondingly to the dummy latent image, and the step of inspecting the resist pattern includes the detection of the presence or non-presence of a cut in the dummy resist in the longitudinal direction.

According to the invention, the dummy latent image extends in an unbroken manner and hence, when there is no cut in the photoresist layer, the dummy resist naturally has no cut. On the other hand, when there is the cut in the photoresist layer, the cut is formed in the dummy resist. That is, when there is the cut in the dummy resist, there arises a doubt that the cut is formed in the whole photoresist layer. Based on this determination, it is possible to easily perform the patterning inspection of the photoresist layer by detecting the presence or non-presence of the cut in the dummy resist in the longitudinal direction.

(2) In the method of inspecting patterning of a photoresist described in (1), the plurality of dummy latent images may be set to be arranged in a row parallel to the longitudinal direction of the slit in the exposure.

(3) In the method of inspecting patterning of a photoresist described in (2), a region of the latent image excluding the plurality of dummy latent images may contain a plurality of cell regions, each one of the plurality of cell regions may contain an element latent image corresponding to a circuit element, and the exposure may be performed such that one dummy latent image is positioned adjacent to one cell region.

(4) In the method of inspecting patterning of a photoresist described in any one of (1) to (3), the exposure may be performed so as to transfer the dummy latent image to an edge portion of the photoresist layer positioned on an upstream side in the relative moving direction of the nozzle.

(5) In the method of inspecting patterning of a photoresist described in any one of (1) to (4), the step of inspecting the resist pattern may contain imaging of the dummy resist by a camera, and the imaging may be performed by moving the camera relatively in the longitudinal direction of the dummy resist by moving at least one of the camera and the substrate.

(6) The invention is also directed to a method of inspecting patterning of a photoresist which is performed in a step of forming a plurality of film patterns by stacking, the step of forming a plurality of film patterns including the steps of: forming a film; forming a photoresist layer on the film by moving a nozzle in the direction perpendicular to the longitudinal direction of a slit of the nozzle relative to the film while supplying a photoresist liquid from the slit of the nozzle above the film; forming a resist pattern which covers a portion of the film by patterning the photoresist layer by photolithography; inspecting the resist pattern; etching the film using the resist pattern as a mask; and removing the resist pattern, wherein the photolithography includes an exposure which is performed so as to transfer a latent image to the photoresist layer, and a development of the photoresist layer which is performed so as to leave the latent image, the latent image contains a dummy latent image which extends in an unbroken manner parallel to the longitudinal direction of the slit, the resist pattern contains a dummy resist formed correspondingly to the dummy latent image, and the step of inspecting the resist pattern includes the detection of the presence or non-presence of a cut in the dummy resist in the longitudinal direction.

According to the invention, the dummy latent image extends in an unbroken manner and hence, when there is no cut in the photoresist layer, the dummy resist naturally has no cut. On the other hand, when there is the cut in the photoresist layer, the cut is formed in the dummy resist. That is, when there is the cut in the dummy resist, there arises a doubt that the cut is formed in the whole photoresist layer. Based on this determination, it is possible to easily perform the patterning inspection of the photoresist layer by detecting the presence or non-presence of the cut in the dummy resist in the longitudinal direction.

(7) In the method of inspecting patterning of a photoresist described in (6), the plurality of film patterns may include a plurality of dummy film patterns, each of the plurality of dummy film patterns may be formed correspondingly to the dummy resist, and a transfer position of the dummy latent image may be set such that the plurality of dummy resists which correspond to the plurality of film patterns do not overlap with each other in the exposure.

DETAILED DESCRIPTION OF THE INVENTION

Hereinafter, embodiments of the invention are explained in conjunction with drawings.

[First Embodiment]

Figure 1:
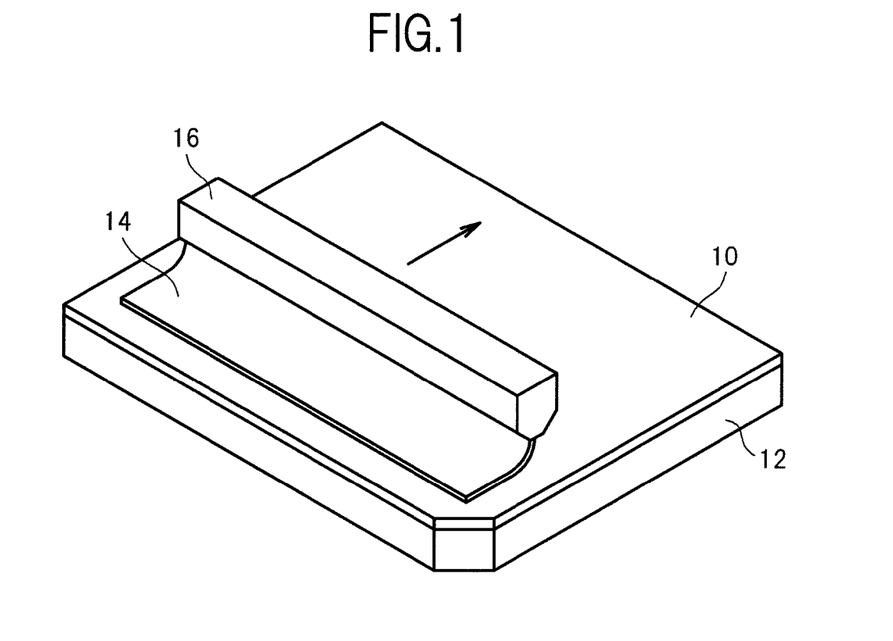
FIG. 1 is a view for explaining a process in which a photoresist liquid is supplied in a method of inspecting patterning of a photoresist according to a first embodiment of the invention.

FIG. 1 is a view for explaining a process in which a photoresist liquid is supplied in a method of inspecting patterning of a photoresist according to a first embodiment of the invention.

As shown in FIG. 1, a substrate 12 on which a film 10 is formed is preliminarily prepared. The film 10 is made of an etchable material such as metal, semiconductor, oxide or nitride. That is, the film 10 constitutes an object to be etched.

Figure 2:
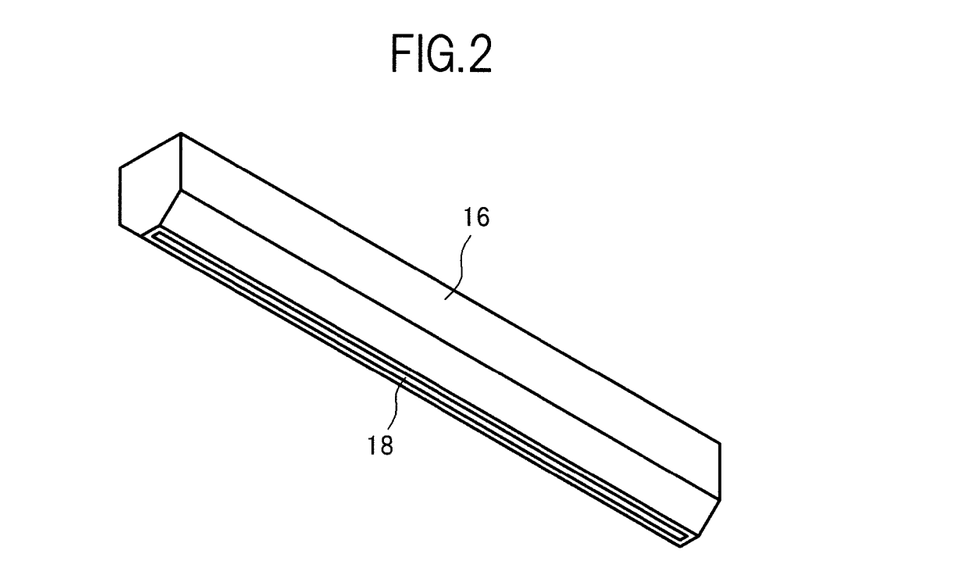
FIG. 2 is a view showing a slit of a nozzle.

A photoresist liquid 14 is supplied to the film 10 formed on the substrate 12. A slit coater is used for supplying the photoresist liquid 14. The slit coater has a nozzle 16 shown in FIG. 2. In FIG. 2, the nozzle 16 has a slit 18 which constitutes a discharge port. The slit 18 is formed of an elongated opening.

The nozzle 16 is arranged above the film 10, and the photoresist liquid 14 is supplied on the film 10 from the slit 18. The photoresist liquid 14 is supplied in a strip shape (in a curtain shape). The nozzle 16 is moved relative to the substrate 12 in the direction perpendicular to the longitudinal direction of the slit 18 (to be more specific, in the direction parallel to a surface of the substrate 12). The relative movement of the nozzle 16 may be brought by moving only the nozzle 16 while fixing the substrate 12, by moving only the substrate 12 while fixing the nozzle 16, or by moving both the substrate 12 and the nozzle 16.

Figure 3:
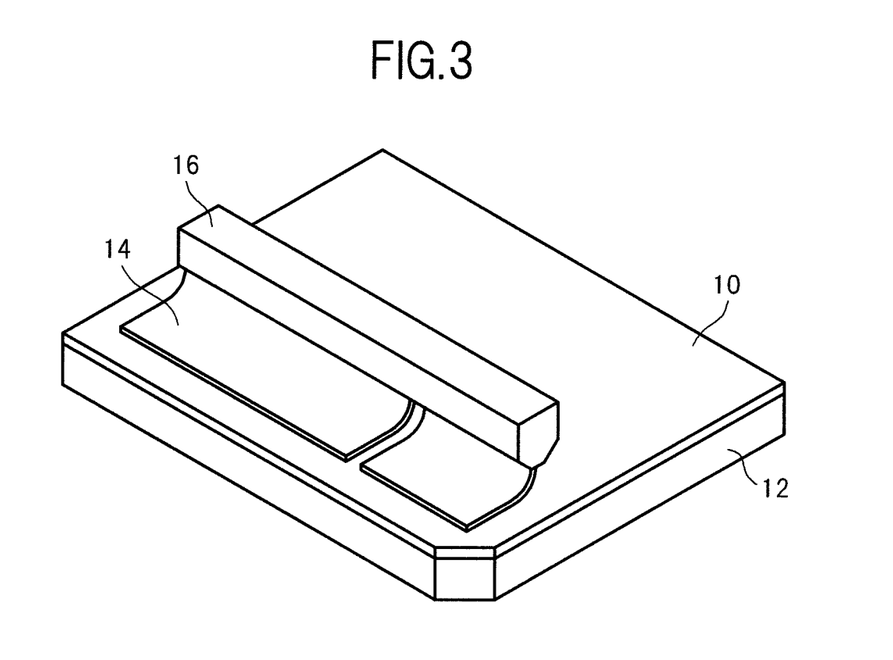
FIG. 3 is a view showing the supply of the photoresist liquid performed when the nozzle has a defect.

FIG. 3 is a view showing the supply of the photoresist liquid 14 performed when the nozzle 16 has a defect. With respect to the slit 18 of the nozzle 16, there may be a case where a portion of the opening is narrowed or clogged due to a clot of the photoresist liquid 14, the adhesion of a dust or the like. In such a case, there exists a possibility that a strip shape of the photoresist liquid 14 supplied from the nozzle 16 is cut.

Figure 4A:
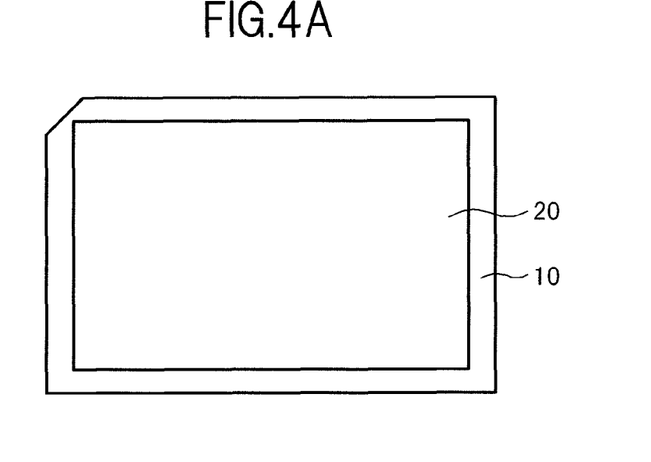
FIG. 4A is a view showing a photoresist layer which is formed using a normally-operated nozzle.
Figure 4B:
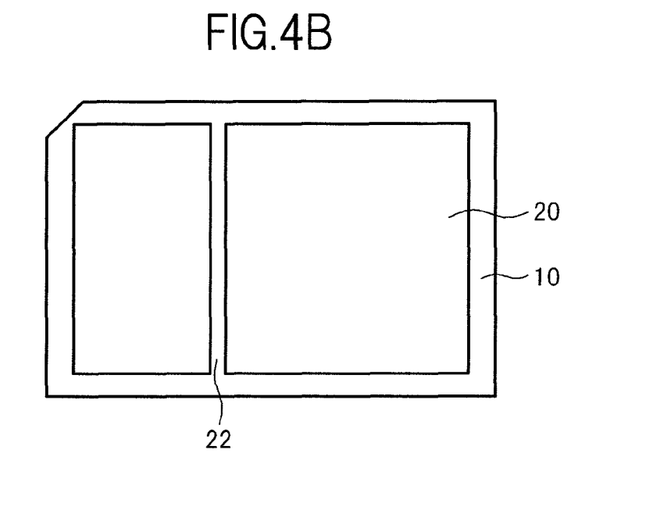
FIG. 4B is a view showing a photo resist layer which is formed using a nozzle having a defect.

The photoresist liquid 14 is formed into a photoresist layer 20 on the film 10. FIG. 4A shows the photoresist layer 20 which is formed using the normally-operated nozzle 16, and FIG. 4B shows the photoresist layer 20 which is formed using the nozzle 16 having a defect. When the supplied photoresist liquid 14 is cut as shown in FIG. 3, a cut 22 is formed in a portion of the photoresist layer 20 as shown in FIG. 4B. When the photoresist layer 20 having the cut 22 is used, the patterning of the photoresist layer 20 by photolithography cannot provide a desired resist pattern. According to this embodiment, it is possible to detect the occurrence of a defect attributed to the cut 22 at an early stage.

In this embodiment, the photoresist layer 20 is patterned by photolithography.

Figure 5:
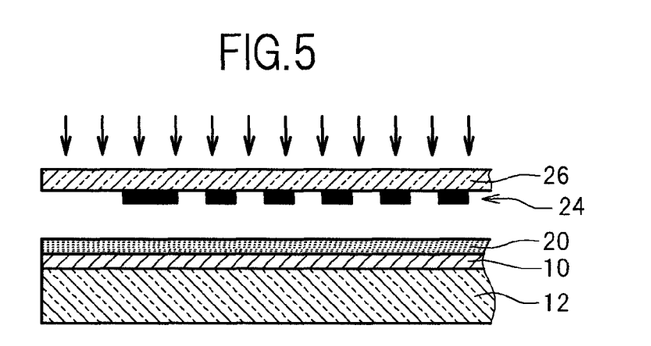
FIG. 5 is a view for explaining an exposure process.

FIG. 5 is a view for explaining an exposure process. The photolithography includes an exposure in which a latent image 24 is transferred to the photoresist layer 20. The latent image 24 is formed on a photo mask 26. Here, the latent image 24 has a shape of the photoresist layer 20 corresponding to a shape of portions which remain after development. To be more specific, the latent image 24 is formed of portions to which light is not radiated when a positive photoresist where exposed portions are removed by developing is used, while the latent image 24 is formed of portions to which light is radiated when a negative photoresist where exposed portions remain after developing is used.

Figure 6A:
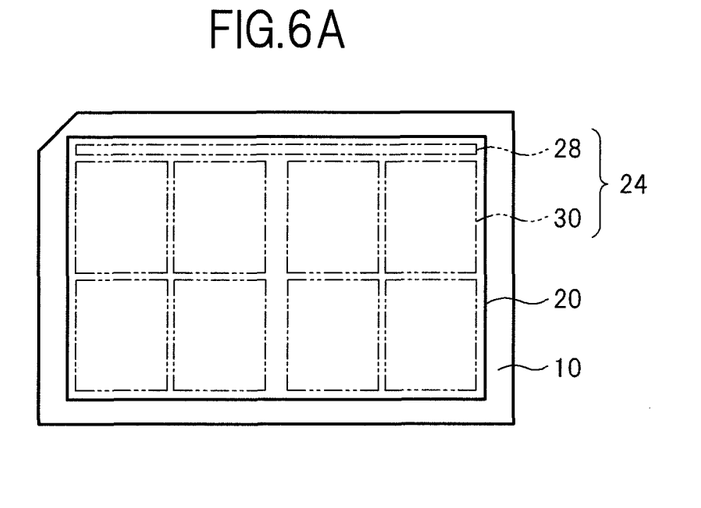
FIG. 6A is a view showing a latent image which is transferred to a normal photoresist layer.
Figure 6B:
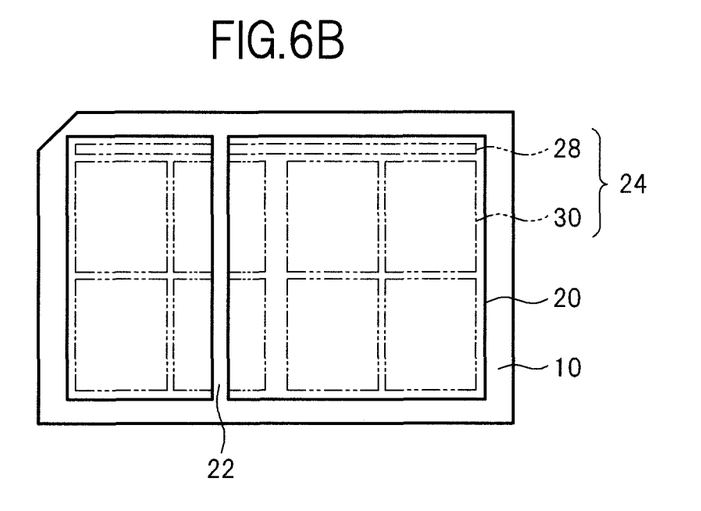
FIG. 6B is a view showing a latent image which is transferred to a photoresist layer having a defect.

FIG. 6A shows the latent image 24 which is transferred to the normal photoresist layer 20, and FIG. 6B shows the latent image 24 which is transferred to the photoresist layer 20 having a defect. As shown in FIG. 6B, the cut 22 formed in the photoresist layer 20 cuts the latent image 24.

The latent image 24 contains a dummy latent image 28 which extends in an unbroken manner parallel to the longitudinal direction of the slit 18 (see FIG. 2). A region of the latent image 24 excluding the dummy latent image 28 contains a plurality of cell regions 30. Each one of the plurality of cell regions 30 includes an element latent image (not shown in the drawing) which corresponds to a circuit element.

The exposure is performed in such a manner that the dummy latent image 28 is transferred to an edge portion of the photoresist layer 20 positioned on an upstream side (left side in FIG. 1) in the relative moving direction of the nozzle 16. As a modification, the exposure may be performed in such a manner that the dummy latent image 28 is transferred to an edge portion of the photoresist layer 20 positioned on a downstream side (a side indicated by an arrow in FIG. 1) in the relative moving direction of the nozzle 16. It may also be possible to perform the exposure in such a manner that the dummy latent image 28 is transferred to both edge portions of the photoresist layer 20 positioned on both upstream and downstream sides in the relative moving direction of the nozzle 16. Further, the dummy latent image 28 may be transferred to regions arranged between both edge portions in addition to both edge portions of the photoresist layer 20 positioned on both upstream and downstream sides in the relative moving direction of the nozzle 16.

Figure 7:
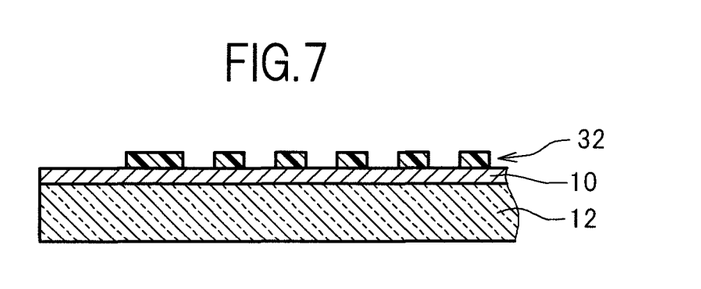
FIG. 7 is a view for explaining a process of a photolithography after performing the exposure.

FIG. 7 is a view for explaining a process of the photolithography performed after the exposure is performed. The photolithography includes the development of the photoresist layer 20 which is performed in such a manner that the latent image 24 remains. Due to the development, portions of the photoresist layer 20 which correspond to the latent image 24 remain, and other portions of the photoresist layer 20 are removed. After the development is performed, the portions of the photoresist layer 20 which correspond to the latent image 24 formed by the photolithography are baked thus forming a resist pattern 32 from the photoresist layer 20.

Figure 8A:
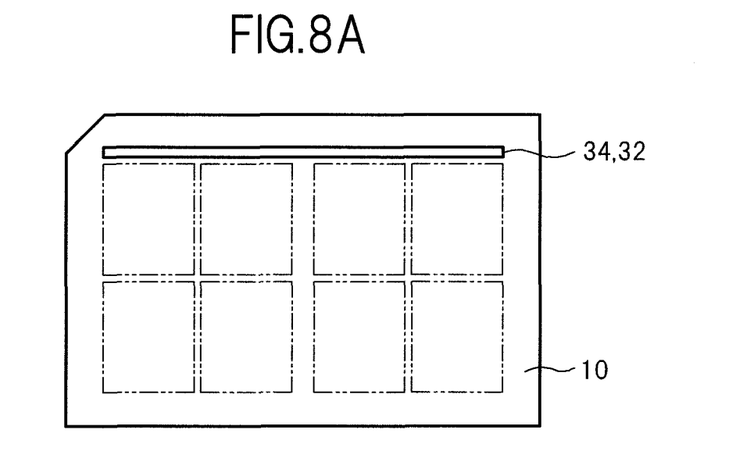
FIG. 8A is a view showing a resist pattern which is formed from the normal photoresist layer.
Figure 8B:
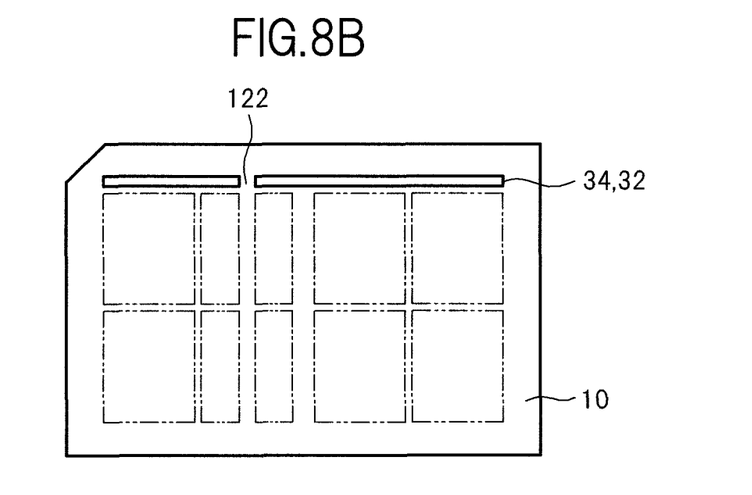
FIG. 8B is a view showing a resist pattern which is formed from the photoresist layer having a defect.

FIG. 8A is a view showing the resist pattern 32 formed from the normal photoresist layer 20, and FIG. 8B is a view showing the resist pattern 32 which is formed from the photoresist layer 20 having a defect.

From the photoresist layer 20, the resist pattern 32 which covers a portion of the film 10 is formed. The resist pattern 32 includes a dummy resist 34 formed correspondingly to the dummy latent image 28. As shown in FIG. 8B, a cut 122 is formed in the dummy resist 34 correspondingly to the cut 22 formed in the photoresist layer 20.

Figure 9A:
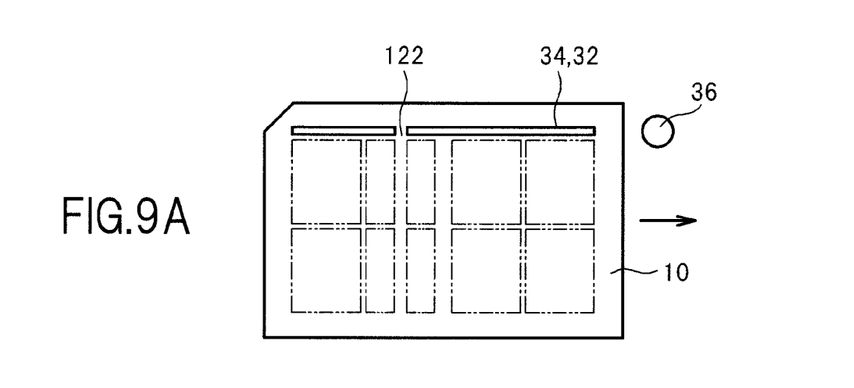
FIG. 9A to FIG. 9C are views for explaining steps of inspecting the resist pattern.
Figure 9B:
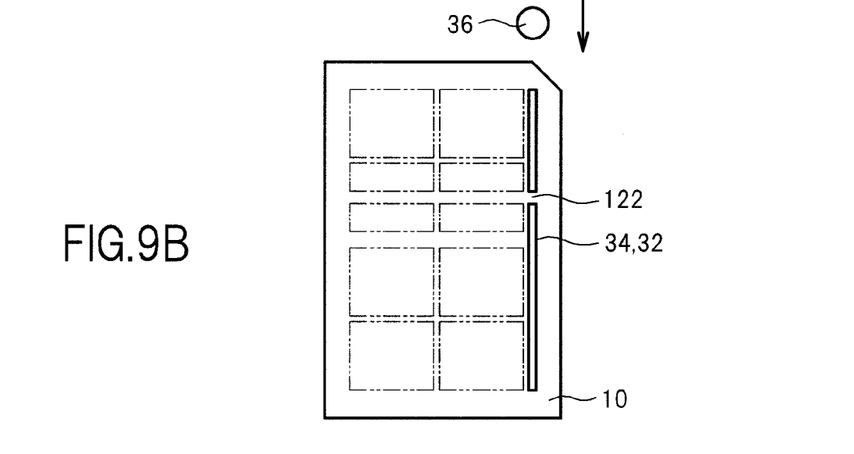
Figure 9C:
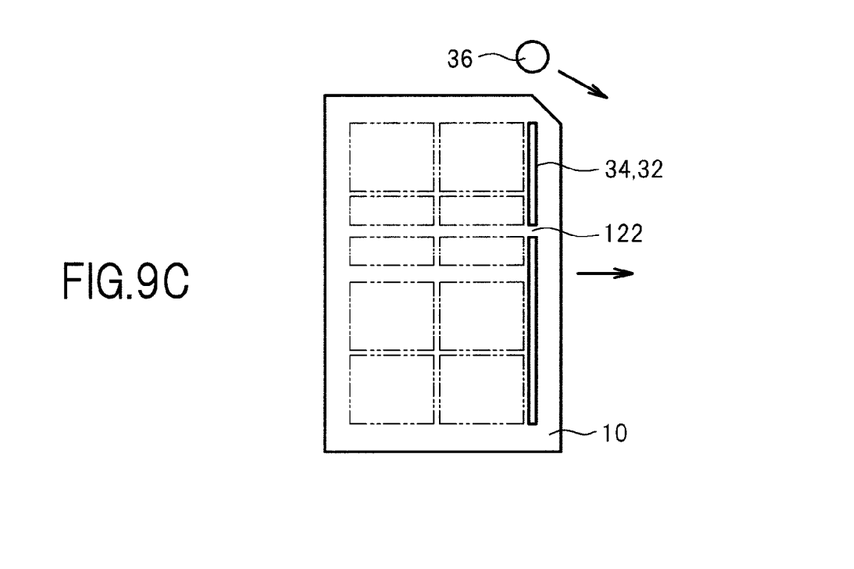

FIG. 9A to FIG. 9C are views for explaining steps of inspecting the resist pattern 32. In this embodiment, the resist pattern 32 is inspected. The step of inspecting the resist pattern 32 includes the detection of the presence or non-presence of the cut 122 in the dummy resist 34 in the longitudinal direction. For example, the dummy resist 34 is imaged by a camera 36. The imaging is performed such that the camera 36 is moved in the longitudinal direction of the dummy resist 34 relative to the dummy resist 34 by moving at least one of the camera 36 and the substrate 12.

For example, as shown in FIG. 9A, the imaging may be performed by moving the substrate 12 while fixing the camera 36. The imaging may also be performed, as shown in FIG. 9B, by moving the camera 36 while fixing the substrate 12. Further, the imaging may also be performed, as shown in FIG. 9C, by moving both the substrate 12 and the camera 36.

According to this embodiment, the dummy latent image 28 extends in an unbroken manner and hence, when there is no cut 22 in the photoresist layer 20, the dummy resist 34 naturally has no cut 122. On the other hand, when there is the cut 22 in the photoresist layer 20, the cut 122 is formed in the dummy resist 34. That is, when there is the cut 122 in the dummy resist 34, there arises a doubt that the cut 22 is formed in the whole photoresist layer 20. Based on this determination, it is possible to easily perform the patterning inspection of the photoresist layer 20 by detecting the presence or non-presence of the cut 122 in the dummy resist 34 in the longitudinal direction.

Figure 10:
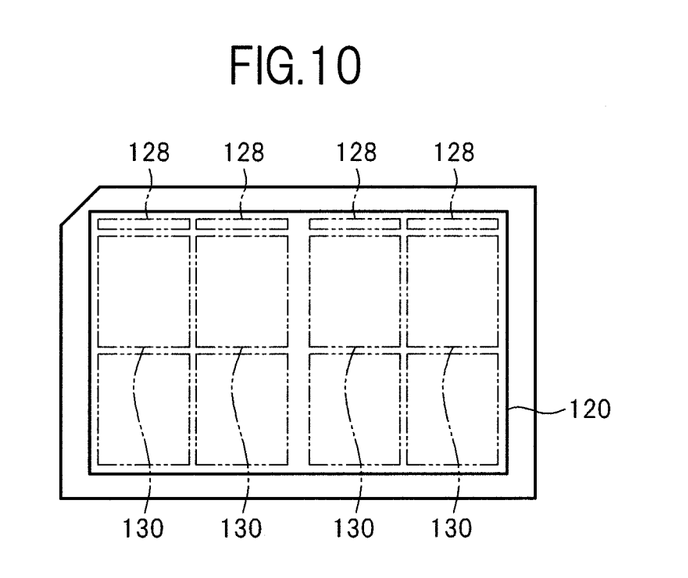
FIG. 10 is a view for explaining a modification of a method of inspecting patterning of a photoresist according to the first embodiment of the invention.

FIG. 10 is a view for explaining a modification of a method of inspecting patterning of a photoresist according to the first embodiment of the invention.

In this modification, a plurality of dummy latent images 128 are transferred to a photoresist layer 120 by performing the exposure. The plurality of dummy latent images 128 are set such that the dummy latent images 128 are arranged in a row parallel to the longitudinal direction of the slit 18 (see FIG. 2). As a result, a plurality of dummy resists (not shown in the drawing) are formed such that the dummy resists are arranged in a row.

Further, the exposure is performed such that one dummy latent image 128 is positioned adjacent to one cell region 130. As a result, the dummy resist is formed adjacent to a portion of the photoresist layer 120 corresponding to the cell region 130 in a resist pattern.

Figure 11:
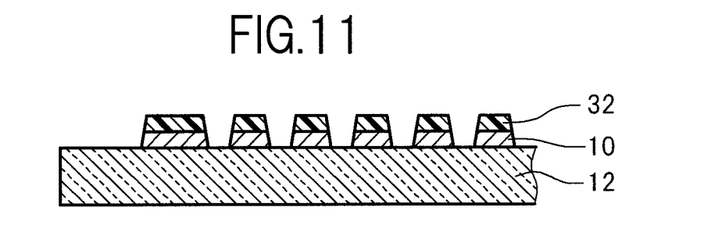
FIG. 11 is a view for explaining steps which are performed after the formation of the resist pattern.
Figure 12:
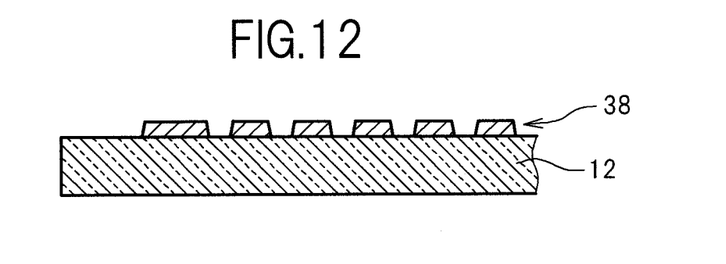
FIG. 12 is a view for explaining steps which are performed after the formation of the resist pattern.

FIG. 11 and FIG. 12 are views for explaining steps which are performed after the formation of the resist pattern 32. As shown in FIG. 11, the film 10 is etched using the resist pattern 32 as a mask. Then, as shown in FIG. 12, the resist pattern 32 is removed thus forming a film pattern 38. By forming the film 10 using a conductive body, a wiring pattern is formed as the film pattern 38.

[Second Embodiment]

Figure 13:
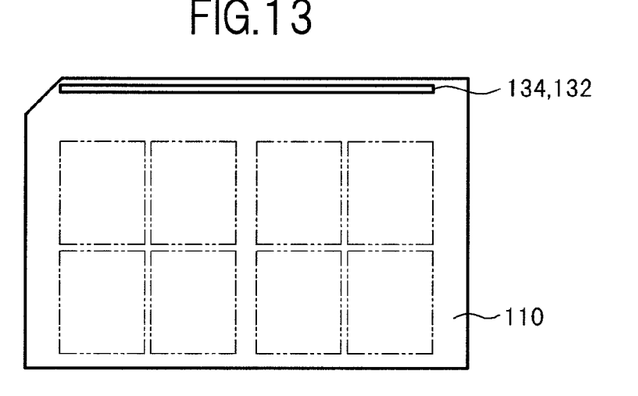
FIG. 13 is a view for explaining a method of inspecting patterning of a photoresist according to a second embodiment of the invention.
Figure 14:
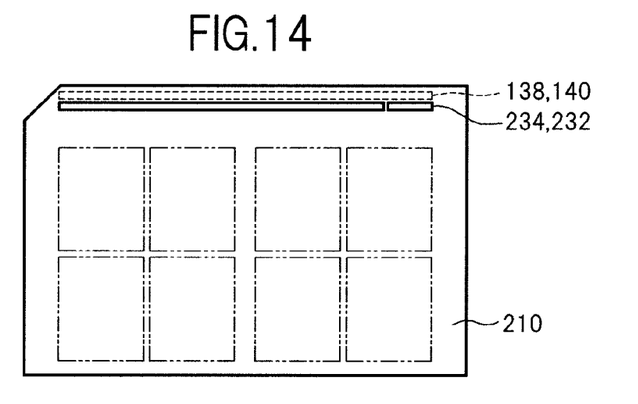
FIG. 14 is a view for explaining the method of inspecting patterning of a photoresist according to the second embodiment of the invention.
Figure 15:
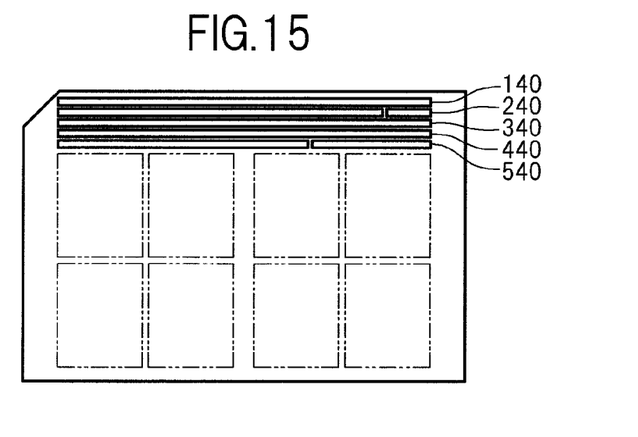
FIG. 15 is a view for explaining the method of inspecting patterning of a photoresist according to the second embodiment of the invention.

FIG. 13 to FIG. 15 are views for explaining a method of inspecting patterning of a photoresist according to a second embodiment of the invention. In this embodiment, the photoresist is formed by stacking a plurality of film patterns.

As shown in FIG. 13, a resist pattern 132 is formed using the process explained in conjunction with the first embodiment. The resist pattern 132 includes a dummy resist 134, and the inspection is performed using the dummy resist 134. Thereafter, a film 110 is etched using the resist pattern 132 as an etching resist thus forming a film pattern 138 (see FIG. 14). The film pattern 138 includes a dummy film pattern 140 (see FIG. 14). Thereafter, the resist pattern 132 is removed.

Next, a second-layer film 210 is formed on the first-layer film pattern 138 and, as shown in FIG. 14, a resist pattern 232 is formed on the second-layer film 210. A step of forming the resist pattern 232 is exactly equal to the corresponding step explained in conjunction with the first embodiment. Then, the inspection is performed using a dummy resist 234.

Here, transfer positions of dummy latent images in the exposure are set such that the dummy resists 134, 234 which correspond to the first-layer film pattern and the second-layer film pattern, respectively do not overlap with each other. Accordingly, a first-layer dummy film pattern 140 and a second-layer dummy film pattern 240 (see FIG. 15) do not overlap with each other.

The film patterns in plural layers are formed by repeating substantially equal steps. To be more specific, when a process of forming a (n-th)-layer film pattern is finished, a (n+1) th film is formed on a (n-th)-layer film pattern so as to form the (n+1) th layer film pattern.

As shown in FIG. 15, a plurality of stacked film patterns include a plurality of dummy film patterns 140, 240, 340, 440 and 540. Each of the plurality of dummy film patterns 140, 240, 340, 440 and 540 is formed correspondingly to the dummy resist. A transfer position of a dummy latent image is set such that the plurality of dummy resists which correspond to the plurality of film patterns do not overlap with each other in the exposure.

According to this embodiment, when there exists a cut in the dummy resist, a cut is also formed in the dummy film pattern formed correspondingly to the dummy resist. Accordingly, even after the inspection using the dummy resist is performed, it is possible to inspect again the dummy film pattern having a shape corresponding to the dummy resist. Accordingly, it is possible to inspect again the patterning of photoresist layers in plural layers.

The invention is not limited to the above-mentioned embodiments and various modifications are conceivable. For example, the constitutions explained in conjunction with the embodiments can be replaced with constitutions substantially equal to such constitutions, constitutions which acquire the same manner of operation and advantageous effects as such constitutions, and constitutions which achieve the same object as such constitutions.

What is claimed is:

1. A method of inspecting a formed photoresist pattern comprising:

forming a photoresist layer on a film formed on a substrate by moving a nozzle in the direction perpendicular to the longitudinal direction of a slit of the nozzle relative to the substrate while supplying a photoresist liquid from the slit of the nozzle above the film;

forming a resist pattern which covers a portion of the film by patterning the photoresist layer by photolithography; and inspecting the resist pattern, wherein the photolithography includes an exposure which is performed so as to transfer a latent image to the photoresist layer, and a development of the photoresist layer which is performed so as to leave the latent image, the latent image contains a dummy latent image which is formed in directions parallel to and perpendicular to the longitudinal direction of the slit including a portion which extends in an unbroken manner parallel to the longitudinal direction of the slit, the resist pattern contains a dummy resist formed correspondingly to the dummy latent image, and the step of inspecting the resist pattern includes the detection of the presence or non-presence of a cut in the dummy resist in the longitudinal direction.

2. The method of inspecting a formed photoresist pattern according to claim 1, wherein the plurality of dummy latent images are set to be arranged in a row parallel to the longitudinal direction of the slit in the exposure.

3. The method of inspecting a formed photoresist pattern according to claim 2, wherein a region of the latent image excluding the plurality of dummy latent images contains a plurality of cell regions, each one of the plurality of cell regions includes an element latent image corresponding to a circuit element, and the exposure is performed such that one dummy latent image is positioned adjacent to one cell region.

4. The method of inspecting a formed photoresist pattern according to claim 1, wherein the exposure is performed so as to transfer the dummy latent image to an edge portion of the photoresist layer positioned on an upstream side in the relative moving direction of the nozzle.

5. The method of inspecting a formed photoresist pattern according to claim 1, wherein the step of inspecting the resist pattern includes imaging of the dummy resist by a camera, and the imaging is performed by moving the camera relatively in the longitudinal direction of the dummy resist by moving at least one of the camera and the substrate.

* * * * *